(12) United States Patent
Morris et al.

(10) Patent No.: US 10,903,879 B2
(45) Date of Patent: Jan. 26, 2021

(54) WIRELESS COMMUNICATIONS DEVICE

(71) Applicant: Microsoft Technology Licensing, LLC, Redmond, WA (US)

(72) Inventors: Toby James Morris, Eugene, OR (US); Marc Harper, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/991,409

(22) Filed: Aug. 12, 2020

(65) Prior Publication Data

US 2020/0373971 A1    Nov. 26, 2020

Related U.S. Application Data

(62) Division of application No. 15/001,093, filed on Jan. 19, 2016, now Pat. No. 10,778,289.

(51) Int. Cl.

| | |
|---|---|
| *H04M 1/00* | (2006.01) |
| *H04B 7/0413* | (2017.01) |
| *H04M 1/02* | (2006.01) |
| *H04B 1/3827* | (2015.01) |
| *H05K 7/20* | (2006.01) |
| *H05K 5/02* | (2006.01) |
| *H01Q 1/22* | (2006.01) |

(Continued)

(52) U.S. Cl.
CPC ......... *H04B 7/0413* (2013.01); *H01Q 1/2291* (2013.01); *H01Q 1/241* (2013.01); *H01Q 1/521* (2013.01); *H01Q 5/50* (2015.01); *H01Q 21/28* (2013.01); *H04B 1/3827* (2013.01); *H04M 1/0245* (2013.01); *H05K 5/0213* (2013.01); *H05K 5/0226* (2013.01); *H05K 7/2039* (2013.01); *H05K 13/00* (2013.01); *H01Q 1/1235* (2013.01); *H04W 88/10* (2013.01)

(58) Field of Classification Search
CPC .................................................... H04W 88/10
See application file for complete search history.

(56) References Cited

U.S. PATENT DOCUMENTS

| | | | | |
|---|---|---|---|---|
| 6,392,883 B1 * | 5/2002 | Ali | ........................ | G06F 1/203 165/185 |
| 6,469,669 B1 * | 10/2002 | Tran | ...................... | H01Q 1/243 343/702 |

(Continued)

FOREIGN PATENT DOCUMENTS

| | | |
|---|---|---|
| CN | 101336497 A | 12/2008 |
| CN | 101511160 A | 8/2009 |

(Continued)

OTHER PUBLICATIONS

"Office Action Issued in European Patent Application No. 17704576. 2", dated Feb. 18, 2020, 7 Pages.

(Continued)

*Primary Examiner* — Barry W Taylor
(74) *Attorney, Agent, or Firm* — Holzer Patel Drennan

(57) ABSTRACT

A wireless communications device with a first housing including an LTE modem and a plurality of LTE antennas and a second housing including a battery system and network communications assembly, the first housing and second housing pivotally joined via a hinge assembly permitting movement of the device between a closed and one or more open positions.

20 Claims, 15 Drawing Sheets

(51) Int. Cl.
*H01Q 21/28* (2006.01)
*H01Q 5/50* (2015.01)
*H01Q 1/24* (2006.01)
*H01Q 1/52* (2006.01)
*H05K 13/00* (2006.01)
*H01Q 1/12* (2006.01)
*H04W 88/10* (2009.01)

(56) References Cited

U.S. PATENT DOCUMENTS

| | | | |
|---|---|---|---|
| 7,746,631 B2* | 6/2010 | Ali | G06F 1/1681 361/679.47 |
| 7,884,572 B2 | 2/2011 | Zhao | |
| 7,916,463 B2 | 3/2011 | Aya et al. | |
| D654,917 S | 2/2012 | Chaturvedi et al. | |
| 8,843,178 B1 | 9/2014 | Wong | |
| 2004/0042184 A1 | 3/2004 | Tomioka | |
| 2007/0146212 A1 | 6/2007 | Ozden et al. | |
| 2009/0207569 A1 | 8/2009 | Tsunoda et al. | |
| 2011/0045881 A1 | 2/2011 | Lo et al. | |
| 2011/0128705 A1 | 6/2011 | Chang | |
| 2012/0002655 A1 | 1/2012 | Bonnassieux et al. | |
| 2012/0120322 A1 | 5/2012 | Satou et al. | |
| 2012/0224329 A1 | 9/2012 | Li et al. | |
| 2013/0076582 A1 | 3/2013 | Nysen | |
| 2013/0076597 A1* | 3/2013 | Becze | H04M 1/0216 345/1.3 |
| 2013/0094485 A1 | 4/2013 | Jiang et al. | |
| 2013/0162554 A1* | 6/2013 | Lauder | G06F 1/1637 345/173 |
| 2013/0195088 A1 | 8/2013 | Ho et al. | |
| 2013/0321559 A1 | 12/2013 | Wu | |
| 2014/0098489 A1 | 4/2014 | Chiriac et al. | |
| 2014/0135060 A1 | 5/2014 | Mercer | |
| 2014/0192716 A1 | 7/2014 | Pantelidou et al. | |
| 2014/0253024 A1 | 9/2014 | Rautiainen et al. | |
| 2014/0333504 A1 | 11/2014 | Basirat | |
| 2015/0085904 A1* | 3/2015 | Seendripu | H04L 27/20 375/219 |
| 2015/0141083 A1 | 5/2015 | Montevirgen et al. | |
| 2015/0237567 A1 | 8/2015 | Xue et al. | |
| 2015/0169014 A1 | 11/2015 | Rivera et al. | |
| 2015/0333401 A1 | 11/2015 | Maruthamuthu et al. | |
| 2016/0043467 A1 | 2/2016 | Desclos et al. | |
| 2016/0327993 A1* | 11/2016 | Garelli | G06F 1/1637 |

FOREIGN PATENT DOCUMENTS

| | | |
|---|---|---|
| CN | 102474004 A | 5/2012 |
| WO | 2014014140 A1 | 1/2014 |

OTHER PUBLICATIONS

"Office Action Issued in Chinese Patent Application No. 201780004813.X", dated May 18, 2020, 11 Pages.

"Office Action Issued in Chinese Patent Application No. 201780004813.X", dated Sep. 2, 2019, 15 Pages.

"International Search Report and Written Opinion Issued in PCT Application No. PCT/US2017/013574", dated Aug. 21, 2017, 18 Pages.

"IsatHub Wi-Fi Satellite HotSpot for Smartphones, Tablets & Laptops", Published on: Sep. 24, 2015 Available at: http://www.groundcontrol.com/IsatHub.htm.

"AT&T—MiFi Liberate 4G Mobile Hotspot", Published on: Mar. 10, 2015 Available at: http://www.bestbuy.com/site/at-t-mifi-liberate-4g-mobile-hotspot-black-at-t/7120165.p?id=1218830172878&skuId=7120165.

Yamada, Kannon, "Karma Mobile Hotspot Review and Giveaway", Published on: Nov. 7, 2013 Available at: http://www.makeuseof.com/tag/karma-mobile-hotspot-review-and-giveaway/.

* cited by examiner

WIRELESS COMMUNICATIONS DEVICE

CROSS-REFERENCE TO RELATED APPLICATIONS

The present application is a division of and claims benefit of priority to U.S. patent application Ser. No. 15/001,093, filed Jan. 19, 2016, entitled "WIRELESS COMMUNICATIONS DEVICE," which is specifically incorporated by reference for all that it discloses and teaches.

BRIEF DESCRIPTIONS OF THE DRAWINGS

DETAILED DESCRIPTIONS

Figure 1:
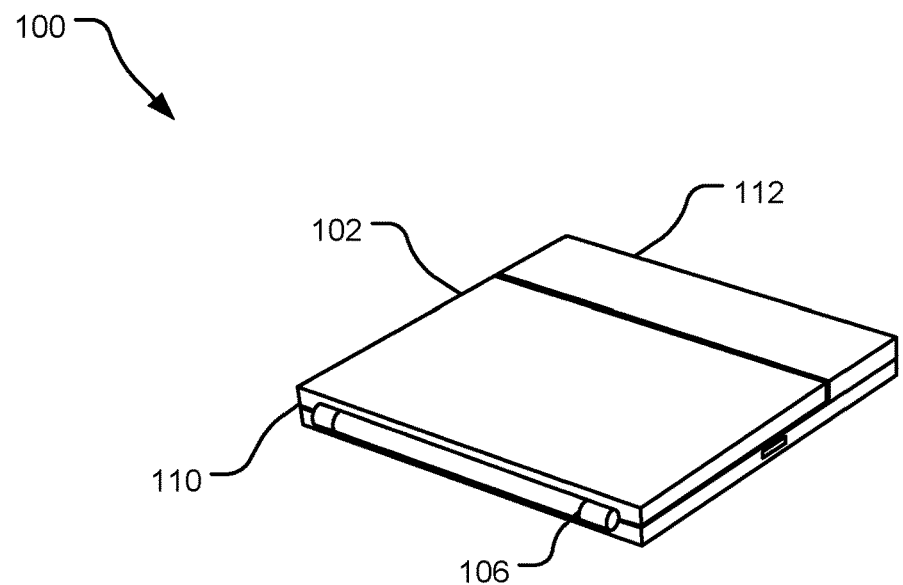
FIG. 1 illustrates an example folding wireless communications device.
Figure 1:
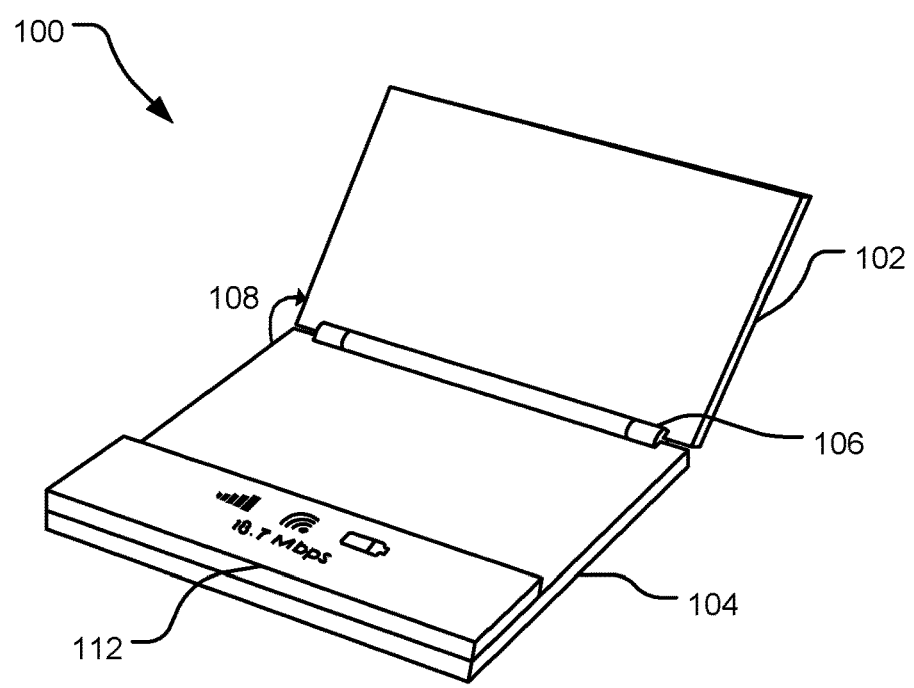

Personal computing devices including laptops and tablets may not have onboard wireless data capabilities, such as 3G or LTE transceivers and antennas, and are therefore connected to the Internet when the devices have access to Local Area Networks (LANs), such as via Wi-Fi or wired Ethernet. To extend the range of network connectivity for these devices, a user may connect the device to a mobile data network using a wireless communications device, also known as a wireless hotspot. The connection between the personal computing device and the wireless communications device may be affected through a USB port such as a USB-C port, wirelessly (such as via a Wi-Fi network established by the wireless communications device), via a Bluetooth connection, or according to other wired or wireless protocols.

A wireless communications device disclosed herein provides a worldwide LTE mobile wireless data connection to personal computing devices in a very small form factor. Worldwide connectivity and a small form factor may be accomplished using double-band or triple-band LTE antennas diplexed or triplexed, respectively, into an LTE modem via a single PCB trace instead of a coaxial cable to economize the consumption of physical space on the device. Further, the small form factor may be permitted by locating heat-producing or interfering components in separate housings moveable with respect to each other between a closed position and one or more open positions. Moving the wireless communications device from the closed position to the one or more open positions physically separates the two housings and one or more of the heat-producing or interfering components contained therein. By moving the wireless communications device into the one or more open positions, the physical separation of the housings decreases thermal proximity between potentially heat-producing components, such as a battery, battery charger, antenna(s), transceiver(s), and/or modem(s), and other on board electronics. The one or more open positions permits improved cooling due to increased air or surface contact on the housings that may be further improved according to active or passive cooling systems as described herein. The physical separation of the housings and components contained therein further reduces or eliminates undesirable interference between components disposed in the housings.

In one implementation, the wireless communications device is a clamshell design including two housings pivotally joined at a hinge assembly. In an implementation, the wireless communications device is closed when the two housings are in contact lengthwise and angle at the hinge assembly is approximately zero degrees. The wireless communications device is in the one or more open positions when the angle measured in degrees between the first and second housings is nonzero. In other implementations, the housings of the wireless communications device are slideably coupled by a slidable coupling, such that a housing is disposed above another housing in the closed position, and the housings are disposed substantially adjacent to one another lengthwise in the one or more open positions. In another implementation, a housing is enclosed inside another housing when the wireless communications device is in the closed position, and the housings are slideably coupled by a slidable coupling, such that a housing extends partially or completely beyond the distal end of another housing in the open position.

The wireless communications device may employ additional heat dissipation materials such as copper spreaders on the first and second housings. For further heat dissipation, the hinge assembly may be formed from a thermally conductive material to act as a heat sink with respect to the first and second housings or the hinge assembly may contain heat dissipation materials, such as a copper spreader in thermal contact with either one or both of the copper spreaders on the first and second housings.

The wireless communications device may advantageously allow a memory for on board storage of user files received via a wired or wireless connection to the personal computing device. The wireless communications device may contain a processor configured to execute code stored on the memory such as operating system code or code downloaded to the hot spot over a digital communications channel. The wireless communications device may further advantageously contain a glass display to determine or display to the user any of the following: the power status of the battery, the current wireless data signal strength, the name of the current wireless carrier, or a current network throughput.

FIG. 1 illustrates an example wireless communications device 100 that includes a first housing 102 and a second housing 104 pivotally joined by a separation interface. In an implementation, the separation interface is hinge assembly 106. In the implementation of FIG. 1, hinge assembly 106 permits the movement of first housing 102 and second housing 104 with respect to each other through an angle (e.g., angles 108, 110) in a "clamshell" configuration. In this implementation, angles 108, 110 may range from 0°, corresponding to a closed position, to 180°, corresponding to a fully open position. Other angles of hinge assembly 106 are available, such as the approximately 110° of angle 108 shown in FIG. 1. In the closed position corresponding to a 0° angle of hinge assembly 106, the hinge assembly extends beyond the edge of first housing 102 and second housing 104.

First housing 102 and second housing 104 may be constructed from a variety of suitable materials. In one implementation, first housing 102 and second housing 104 are polycarbonate. In another implementation, first housing 102 and second housing 104 are formed from black plastic. Hinge assembly 106 may also be constructed from polycarbonate or black plastic. In an implementation, hinge assembly 106 is a heat sink relative to first housing 102 and second housing 104 and may be constructed from a material with a higher thermal conductivity than the materials used to construct first housing 102 and second housing 104. Heat dissipation in wireless communications device 100 is explained in more detail below with reference to FIG. 9.

In an implementation, second housing 104 includes a display 112 for displaying information relevant to the wireless communications device to a user including a mobile signal strength indicator, a battery level indicator, the name of a wireless carrier, a network throughput indicator, and a connectivity indicator indicating whether and how the wireless communications device is communicatively connected to a personal computing device. In an alternative implementation, wireless communications device 100 may cause the display of the aforementioned relevant information on the screen of a connected personal computing device instead of on display 112. In the implementation shown in FIG. 1, the portion of second housing 104 including display 112 is approximately twice as thick as first housing 102, and creates a flush surface between first housing 102 and display 112 when the angle of hinge assembly 105 is approximately 0°, corresponding to the closed position of wireless communications device 100. Display 112 may be enclosed in a black gloss or glass display housing.

In the implementation shown in FIG. 1, display 112 is raised above second housing 104 by an amount roughly equal to the thickness of first housing 102 such that, when wireless communications device 100 is in the closed position, display 112 and first housing 102 sit flush with respect to one another. In this implementation, second housing 104 may measure approximately 6 mm by 72 mm by 74.5 mm, except in the area of display 112 where the thickness is double, approximately 12 mm. First housing 102 in this implementation may measure 6 mm by 72 mm by an amount such that first housing 102 and display 112 equal approximately 74.5 mm. Therefore when wireless communications device 100 in this implementation is in the closed position, its dimensions are approximately 12 mm by 72 mm by 74.5 mm and, when wireless communications device 100 is in the fully open position, i.e., when angle 108 equals approximately 180°, its dimensions are approximately 12 mm by 72 mm by 144 mm.

In an implementation, a display 112 may include a power switch. In another implementation, a dedicated power switch may activate the device. In yet another implementation, the device may be awoken or powered on remotely such as by connecting a cable or wirelessly via a Bluetooth connection, Wi-Fi connection, NFC communications, activation of an on board sensor such as an accelerometer, heat sensor, noise sensor, or temperature sensor. In yet another implementation, the wireless communications device may be powered on or awoken based on a timer or according to a date and time schedule, which may depend on one or more conditions such as remaining battery life or status of connected personal computing devices. The wireless communications device may include a position sensor that indicates the orientation of the first housing with respect to the second housing or indicates whether the angle between the two housings is greater than a predetermined minimum angle. For example, the position sensor could be activated if the angle between the first and second housings is greater than 45 degrees. In another implementation, the position sensor is a Hall effect sensor.

Figure 2:
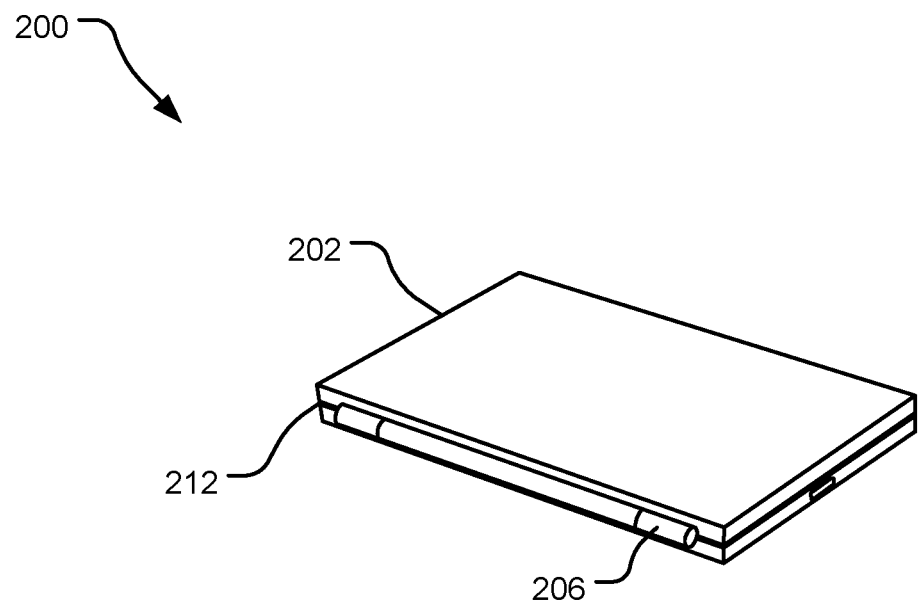
FIG. 2 illustrates an alternative implementation of a folding wireless communications device.
Figure 2:
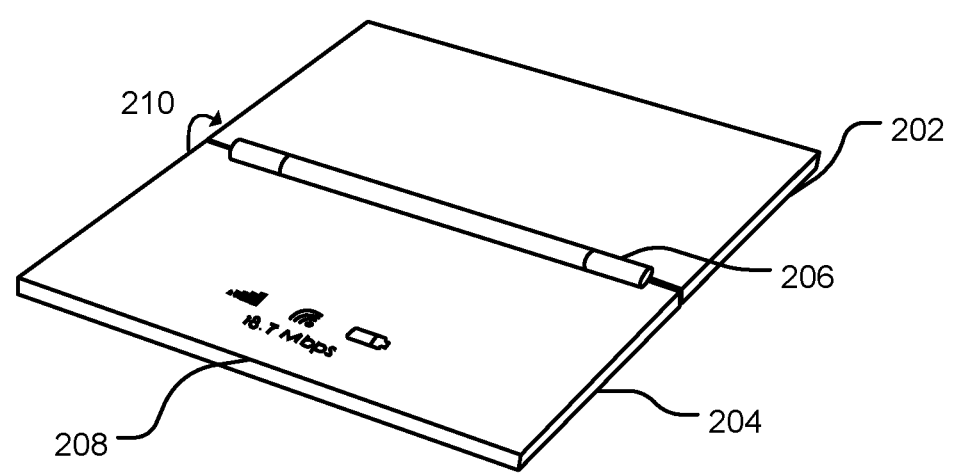

FIG. 2 illustrates another implementation of wireless communications device 200. In the implementation of FIG. 2, a first housing 202 and a second housing 204 are more rectangular with dimensions measuring 7.5 mm by 90 mm by 57 mm for each housing. First housing 202 and second housing 204 are pivotally joined by a separation interface, hinge assembly 206, permitting rotation with respect to each other through angle 210. The wireless communications device 200 is closed when angle 210 measures approximately 0°, and is in the one or more open positions when angle 210 measures a nonzero number of degrees. When wireless communications device 200 is in the closed position in this implementation hinge assembly 206 extends beyond the edge of first housing 202 and second housing 204. The wireless communications device 200 is in the fully open position when angle 210 measures approximately 180°.

In the implementation shown in FIG. 2, second housing 204 integrates display 208. One or both of the inward facing surfaces of first housing 202 and second housing 204 may be formed of a transparent material such as a black gloss display lens to facilitate viewing display 208. Display 208 may display information relevant to the wireless communications device to a user including a mobile signal strength indicator, a battery level indicator, the name of a wireless carrier, a network throughput indicator, and a connectivity indicator indicating whether and how the wireless communications device is communicatively connected to a personal computing device. Display 208's integration into second housing 204 permits both first housing 202 and second housing 204 to have approximately equal dimensions, in contrast to the implementation shown in FIG. 1 where the raised display 112 causes second housing 104 to have a double thickness in the area of display 112 and first housing 102 is consequently shorter than second housing 104 by an amount suitable to permit housing 102 and display 112 to sit flush when wireless communications device 100 is in the closed position.

Figure 3:
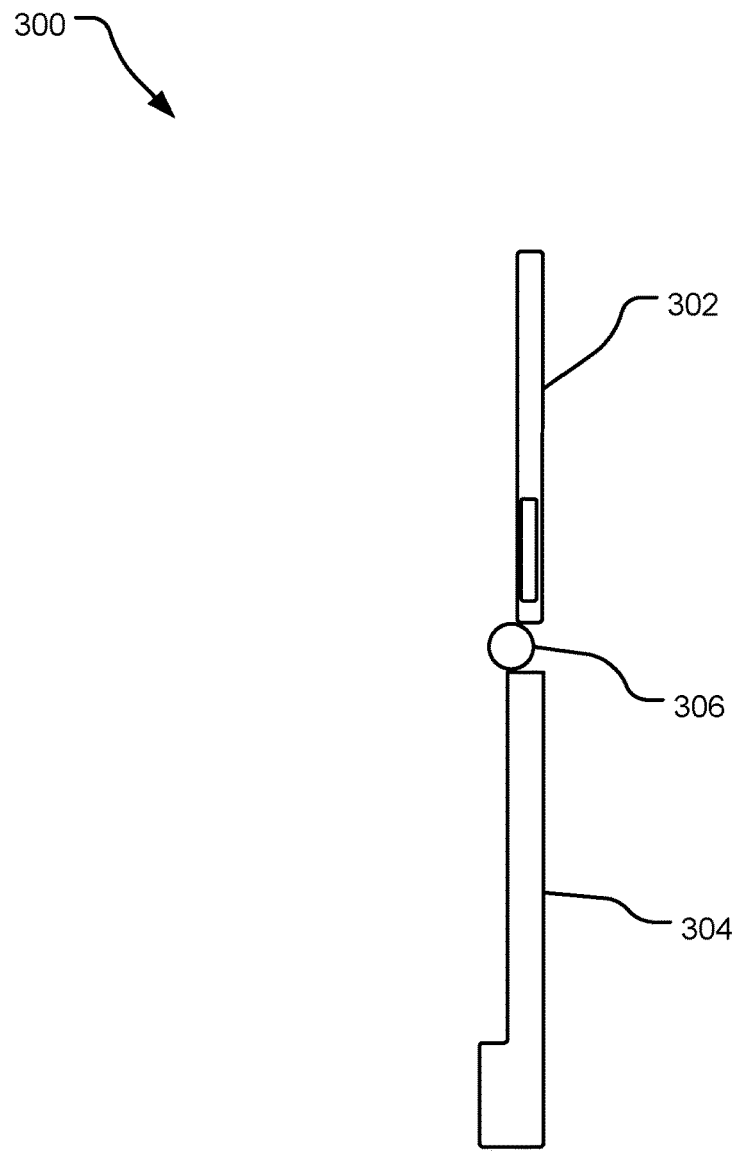
FIG. 3 is a side view of an implementation of a folding wireless communications device.
Figure 4:
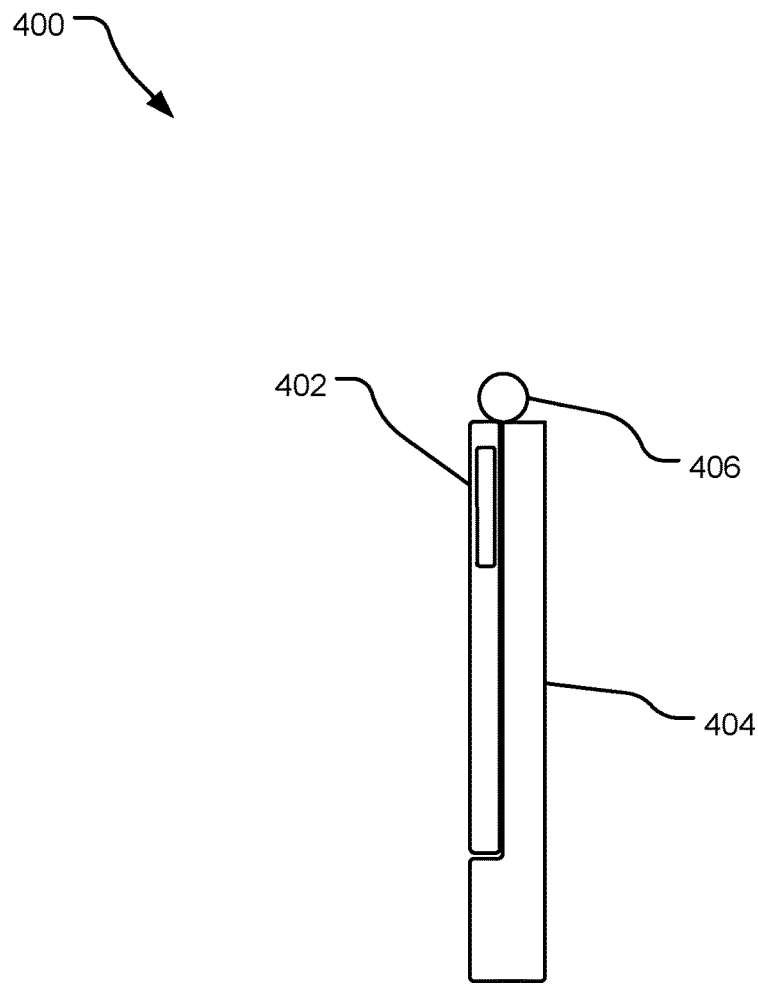
FIG. 4 is another side view of an implementation of a folding wireless communications device.

FIG. 3 is a side view of a wireless communications device 300. In this implementation, first housing 302 and second housing 304 are pivotally joined via a separation interface, hinge assembly 306. Second housing 304 is approximately twice as thick at the lower end to accommodate a display (not shown), and first housing 302 is accordingly shorter than second housing 304 to permit a flush surface between first housing 302 and the display when the device 300 is in the closed position. Also in the closed position, hinge assembly 306 extends beyond the tops of first housing 302 and second housing 304 as shown in FIG. 4, another side view of wireless communications device 400, illustrating first housing 402 mating with second housing 404 by pivoting around separation interface hinge assembly 406.

Figure 5:
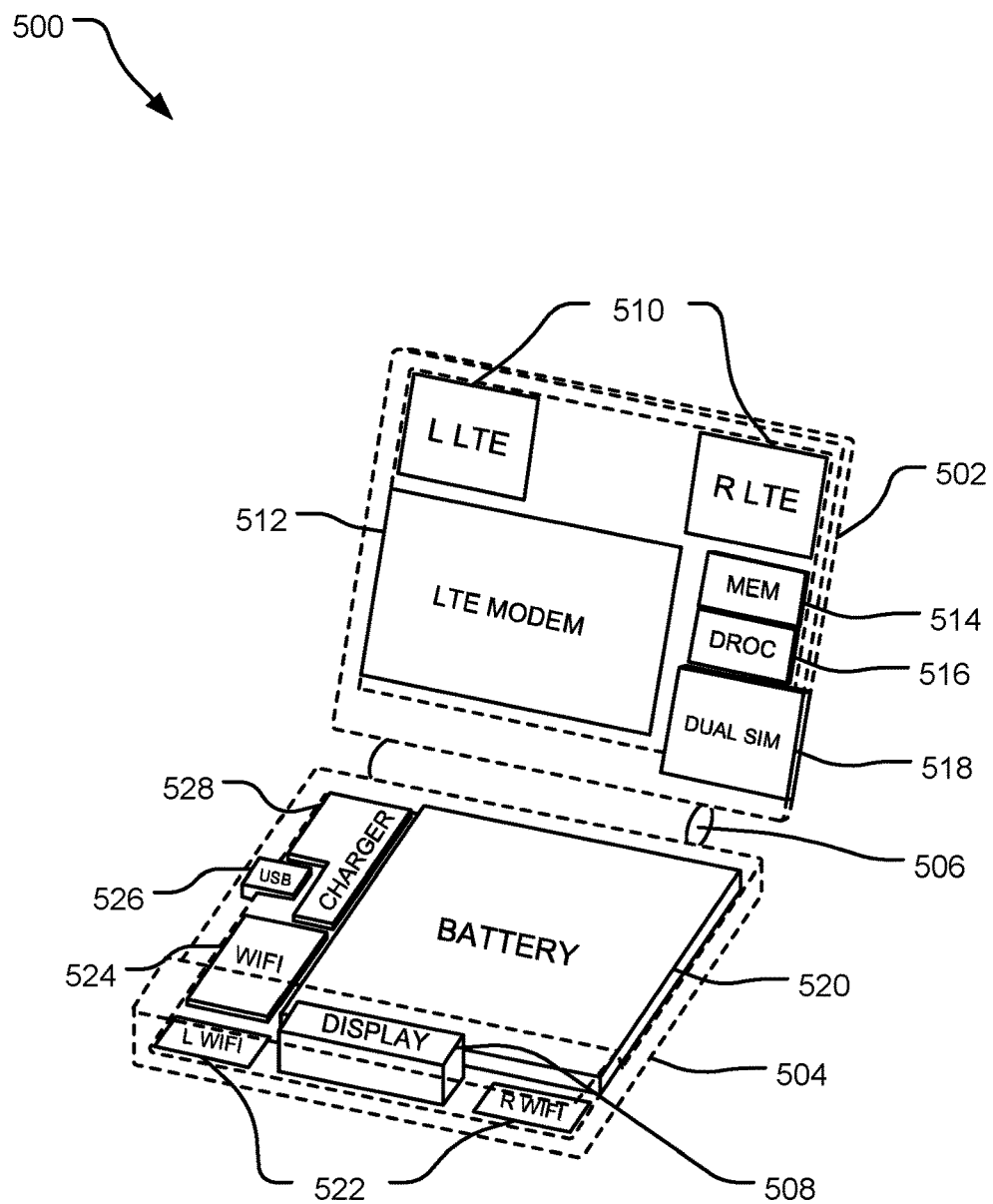
FIG. 5 is a schematic diagram of the contents of a folding wireless communications device.

FIG. 5 is a schematic diagram of the contents of a wireless communications device 500. Wireless communication device 500 includes a first housing 502 and second housing 504 pivotally joined by separation interface hinge assembly 506. In this implementation, first housing 502 contains a first network communication protocol assembly. In an implementation, first network communication protocol assembly may include LTE antennas 510 communicatively coupled to an LTE modem 512. The first network communications assembly may include other types of antennas, such as 3G or other cellular antennas or any other type of communications protocol. In an implementation, multiple bands from LTE antennas 510 may be diplexed or triplexed into LTE modem 512 according to a single PCB trace rather than via a coaxial cable as explained in more detail below with reference to FIGS. 6-8. LTE antennas 510 may be located on the same side of a printed circuit board. First housing 502 may contain memory device 514, processor 516, and additional memory device 518 including without limitation a dual SIM, nano SIM, or flash storage. The elements shown in this implementation contained in first housing 502 are electronically coupled to the elements contained in second housing 504 via a flex circuit across hinge assembly 506 (not shown). The flex circuit may include a flexible substrate with one or more printed circuits on one or both sides of the substrate, and may electronically connect any component housed in first housing 502 to any component housed in second housing 504.

Second housing 504 contains, in this implementation, elements including battery 520, battery charger 528, and a second network communications assembly 522, 524, 526. In this implementation the second network communications assembly includes USB port 526, which may be a USB-C port, Wi-Fi unit 524, and Wi-Fi antennas 522. Second network communications assembly may also include network interfaces to any other type of communications protocol. A user of device 500 connects a personal computing device to the wireless communications device 500 via second network assembly 522, 524, 526. For example, the user of a personal computing device may connect via a wired connection to USB port 526 or via a wireless connection to Wi-Fi unit 524. Other types of connections to the second network assembly 522, 524, 526 are also included, such as via a Bluetooth connection. Second housing 504 also in this implementation includes a display 504. A power switch to enable the user to power the device on and off may be incorporated into display 508.

In an implementation, battery 520 may be a 1500 mAh battery. LTE antennas 510 may have dimensions of 20 mm by 15 mm with a 20 mm separation. LTE modem may measure 1,240 mm². Memory 514 may measure 240 mm². Wi-Fi antennas 508 may measure 15 mm by 8 mm or, in the case of antennas that support only the 5 GHz band, and not 2.4 GHz, Wi-Fi antennas may measure 5 mm by 3 mm.

Figure 6:
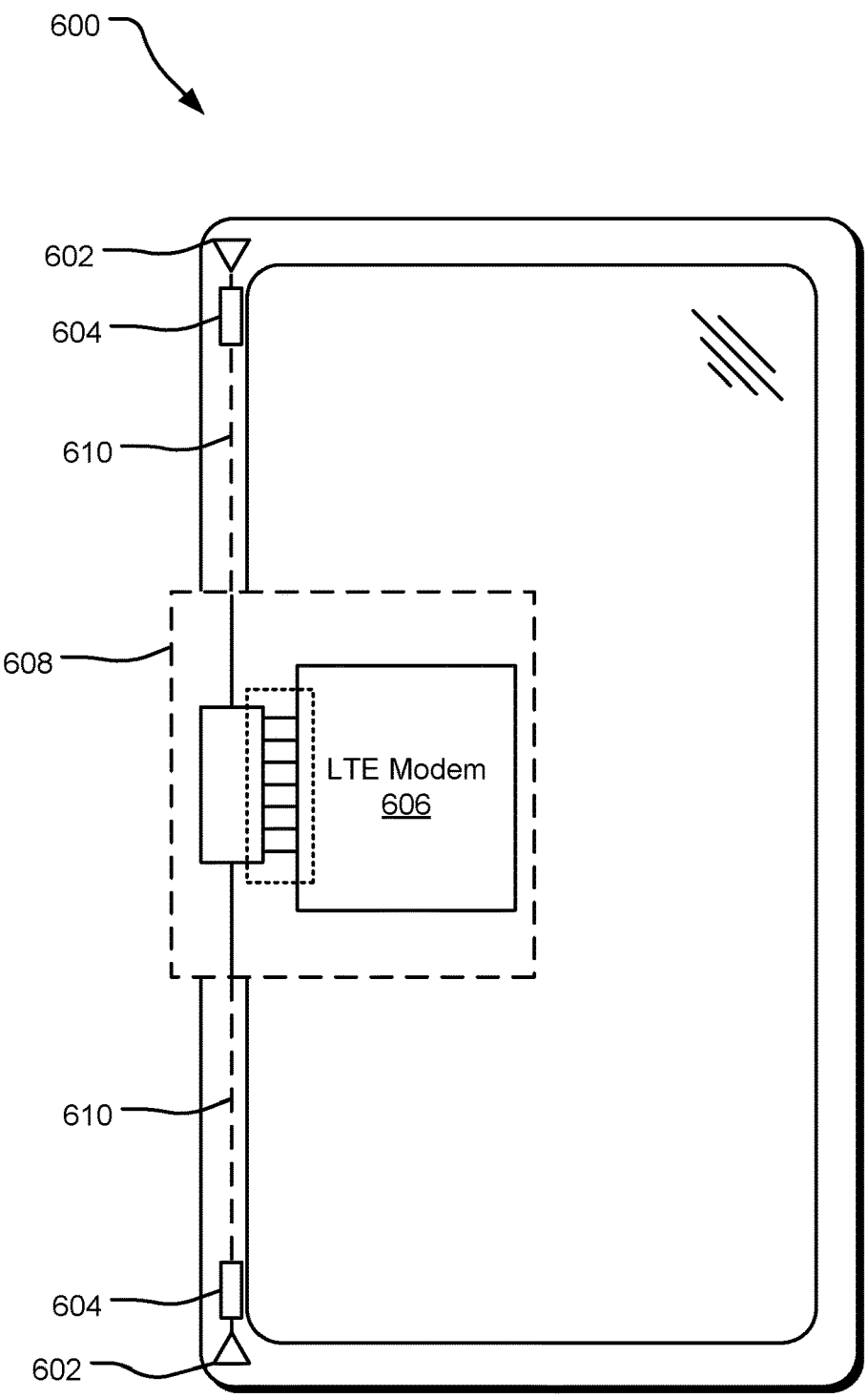
FIG. 6 illustrates another example folding wireless communications device.

FIG. 6 illustrates another example wireless communications device 600. In this implementation, antennas 602 may be communicatively coupled to a single printed circuit board (PCB) transmission line trace, which eliminates the need for a coaxial cable and does not suffer from issues related to the use of multiple transmission line traces such as configurations where the antennas 602 are located at different physical distances from the modem or transceiver. The antenna interface is communicatively coupled to at least one antenna feed and may be configured to filter frequency bands from an antenna signal received from at least one antenna. The antennas are further configured to amplify each of the frequency bands and multiplex the filtered and amplified frequency bands so that all of the frequency bands may share a single transmission line trace. Antennas in this configuration may be positioned with respect to one another closer than ¼ of the wavelength of the lowest frequency band supported by the LTE antennas. In this implementation, wireless communications device 600 includes antennas 602, a switch bank circuitry 608, an LTE modem 606, antenna interfaces 606, and transmission line traces 610.

The antennas 602 may be a main or a diversity antenna of the wireless communications device 600. A main or primary antenna is an antenna that transmits and receives wireless signals to and from base stations, satellites, and other wireless communications systems. The antenna interfaces 606 include a combination of one or more filters and low noise amplifiers (LNAs) that are communicatively coupled to the antennas 602 and transmission line traces 610. The antenna interfaces 606 may be printed or constructed on a chip that may be installed between the antennas 602 and a transmission line trace using multiple communication interfaces (e.g., one or more ports) that allow for the communication of signals. The combination of one or more filters and low noise amplifiers on the antenna interfaces 606 allow for an antenna signal received from antennas 602 to be communicated across the transmission line trace 610 without significant insertion loss along the trace 606. Furthermore, the antenna interfaces 606 may allow the signals to be communicated between the antennas 602 and the switch bank circuitry without the use of a bulky coaxial cable. Because the antenna signal is transmitted along a single transmission line trace (e.g., transmission line traces 610), issues related to using multiple traces may be eliminated.

The switch bank circuitry 608 is a system of discrete electronic components configured to selectively communicate sub-bands of the frequency bands (e.g., high, middle, and low frequency bands) to and from the LTE modem 606 or to and from a transceiver. For example, switch bank circuitry 608 may receive an antenna signal from the transmission line trace 610 and selectively communicate a desired sub-band of the antenna signal to an interface (not shown) at the LTE modem 606. Furthermore, a sub-band signal path 612 may include a band-pass filter (not shown), which is used to pass the selected frequencies within a certain range to the LTE modem 606 or to a transceiver.

The LTE modem 606 and/or transceiver receives sub-bands of antenna signals from the switch bank circuitry 608 and sends sub-bands of antenna signals from communication channels of the wireless communications device 600 to the switch bank circuitry 608. The LTE modem 606 and/or transceiver is communicatively coupled to the communications channels of the wireless communications device 600 such as Wi-Fi antennas a Wi-Fi subsystem, a USB port, or any other communications assembly of the wireless communications device 600. wireless communications device 600 is shown having only one LTE modem 606 and/or transceiver, but it should be understood that the device may have more than one LTE modem or transceiver and it may have more than one type of modem and/or transceiver.

Figure 7:
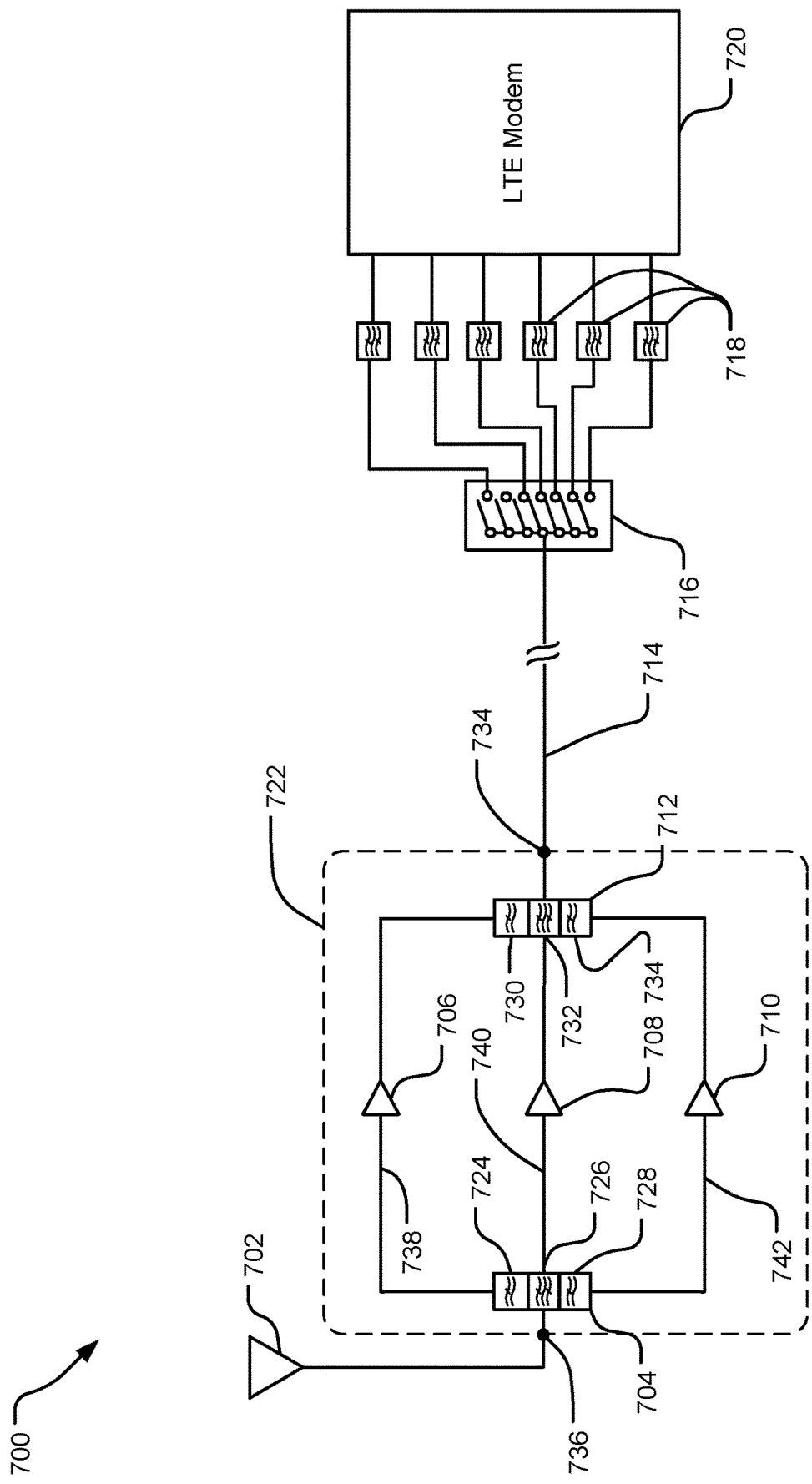
FIG. 7 illustrates an example circuitry for signal transmission between at least one antenna and a transceiver of a wireless communications device.

The above-described antenna configurations and interfaces can be used to transmit signals along a single transmission line trace without the use of a coaxial cable or multiple transmission line traces. These configurations and interfaces are described further with respect to FIG. 7. FIG. 7 is a detail view schematic of an antenna subsystem with multiple bands triplexed into a single PCB trace connected to an LTE modem. It should be understood that the circuitry 700 can be designed on a chip or may be constructed on a printed circuit board assembly (PCBA). The circuitry 700 includes a full band antenna 702, an antenna interface circuitry 722, a transmission line trace 714, a radiofrequency (RF) switch bank 716, and a transceiver and/or LTE modem 720. The full band antenna 702 may be a three feed antenna that may send and receive high, middle, and low RF bands of antenna signals. The antenna is illustrated as being a single component but it should be understood that the antenna 702 may use a combination of single and/or multi-feed antennas.

The antenna interface circuitry 722 may include a number of filters (e.g., filters 724, 726, and 728) and three low noise amplifiers (LNAs) (e.g., LNAs 730, 732, and 734), each LNA configured for a particular frequency band of antenna signal. The antenna interface circuitry 722 may be communicatively coupled to the antenna 702 and transmission line trace 714 via one or more ports (e.g., ports 734 and 736) or other communications interfaces. The antenna interface circuitry 722 may be printed on a chip. The filters (e.g., 724, 726, and 728) may be RLC (resistor-inductor-capacitor) circuit configured to filter a particular frequency band from an antenna signal received from antenna 702. In this example implementation, filters 724, 726, and 728 form a triplexer 704 that receives an antenna signal from the full band antenna 702 and filters the antenna signal to yield three separate signals: a filtered high band RF signal that is directed to a signal path 738; a filtered middle band signal that is directed to a signal path 740; and a filtered low band RF signal that is directed to a signal path 742.

In this example implementation, the LNA 706 is a high band LNA that receives the filtered high band RF signal from the triplexer 704 and amplifies the filtered high band RF and transmits the amplified high band RF signal to three filters (e.g., filters 730, 732, and 734) that form triplexer 712. The LNA 708 is a middle band LNA that receives the filtered middle band RF signal from the triplexer 704 and amplifies the filtered middle band RF signal, and transmits the amplified filtered middle band RF signal to the triplexer 712. The LNA 710 is a low band LNA that receives the filtered low band RF signal from the triplexer 704 and transmits the amplified filtered low band RF signal to the triplexer 712. The triplexer 712 receives each of the three amplified filtered band RF signals and multiplexes the three signals and outputs the signals to the transmission line trace 714. The triplexer 712 may be directly coupled to the transmission line trace 714 or may be coupled to transmission line trace 714 via a port or other communication interface (e.g., the port 734). Because each separate filtered frequency band is amplified and then multiplexed, there may be less noise in the signal when compared to other configurations.

The transmission line trace 714 is a conductive trace that electrically connects the triplexer 712 with the RF switch bank 716. The transmission line trace 714 may be part of a printed circuit board assembly (PCBA). Because of the configuration of the antenna interface circuitry 722, all three of the filtered amplified frequency bands of antenna signals are able to use the transmission line trace 714. This configuration may significantly reduce insertion loss of the signal without the use of a bulky coaxial cable.

The transmission line trace 714 is communicatively coupled to the switch bank circuitry 716. The switch bank circuitry 716 is a system of discrete electronic components configured to selectively communicate sub-bands of the frequency bands (e.g., high, middle, and low frequency bands) to and from LTE modem 720 and/or a transceiver. For example, switch bank circuitry 716 may receive an antenna signal from the transmission line trace 714 and selectively communicate a desired sub-band of the antenna signal to a port at the LTE modem 720 and/or transceiver. Furthermore, a sub-band signal path may include one or more band-pass filters 718, which are used to pass the selected frequencies within a certain range to the LTE modem 720 and/or transceiver.

In another implementation, more than one antenna 702 may be communicatively coupled to circuitry 722. For example, a high- and middle-band antenna may be diplexed into filters 724 and 726 via a first port and a low-band antenna may be coupled to filter 728 via a second port. The three antenna signals may then be triplexed via triplexer 712 into the single transmission line trace 714.

Figure 8:
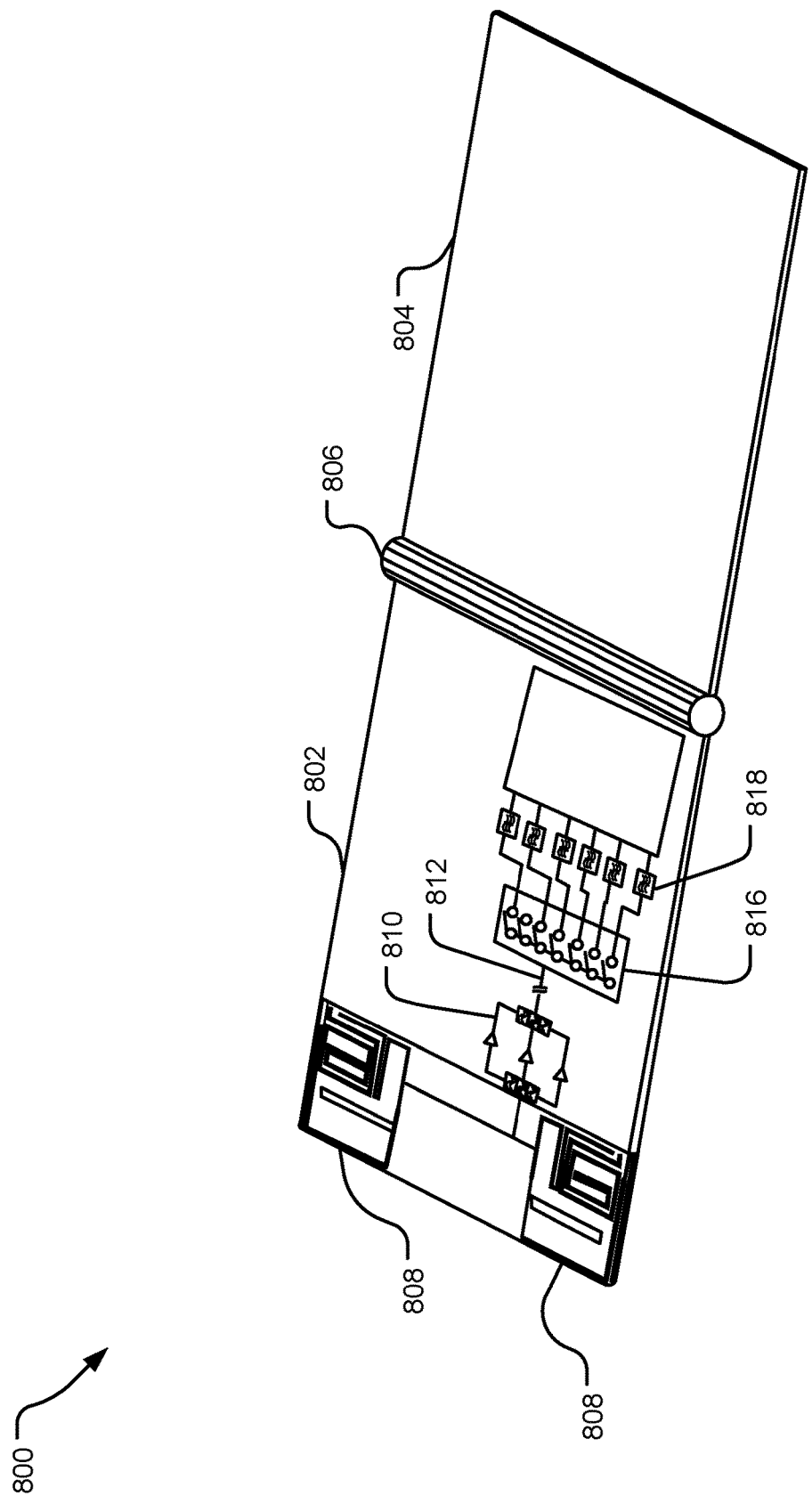
FIG. 8 is a schematic diagram of a wireless communications device including spiral feed monopole LTE antennas with a grounded coupled structure with multiple bands triplexed into a single PCB trace connected to an LTE modem.

FIG. 8 is a schematic diagram of a wireless communications device 800 with LTE antennas 808 disposed in a first housing 802. Wireless communication device 800's antennas 808 may be spiral feed MIMO monopole antennas including without limitation a grounded coupling structure. Antennas 808 may in other implementations include PIFA antennas, dielectrics, loops, capacitive coupled antennas, inductive coupled antennas, aperture tuned antennas, and/or adaptive matching antennas. The first housing 802 is pivotally joined via hinge assembly 806 to a second housing 804. Wireless communication device 800 includes antenna interface circuitry 810 such as the antenna interface circuitry described with respect to FIG. 7 disposed on a first housing 802. Antenna interface circuitry 810 may include with multiple bands triplexed or diplexed into a single PCB trace connected to an LTE modem 814 and/or transceiver via a switching assembly 816 and one or more band-pass filters 818.

Figure 9:
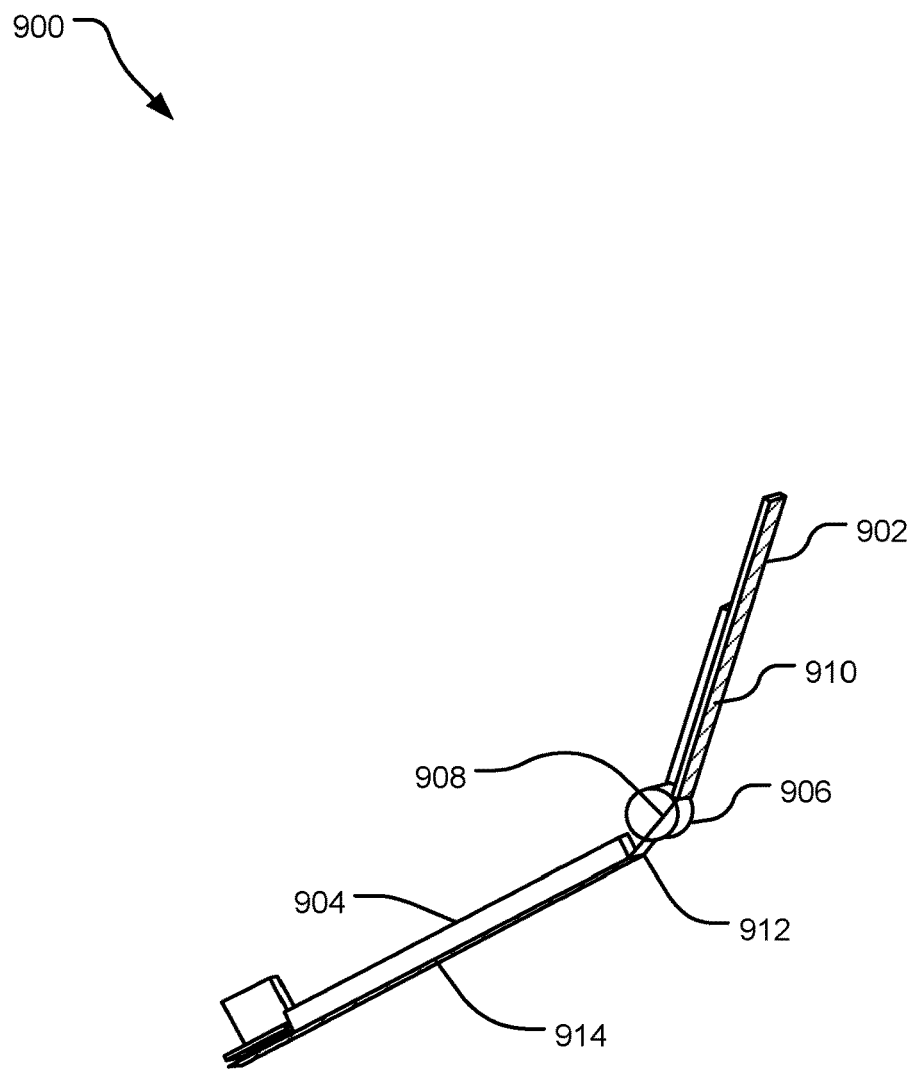
FIG. 9 is a side view of a wireless communications device with heat dissipating spreaders.

FIG. 9 is a side view of a wireless communications device 900 with heat dissipating spreaders. Contents of wireless communications device 900 such as an LTE modem inside housing 902 or a battery system and/or a network communications assembly in second housing 904 could generate heat during operation. As the operating specifications for these components have upper temperature limits, it may be necessary to introduce active or passive cooling features into device 900.

In one implementation, a first heat dissipating plate 910 may be included in first housing 902, a second heat dissipating plate 914 may be included in second housing 904, and/or a third heat dissipating plate 912 in separation interface hinge assembly 906. In an implementation, first heat dissipating plate 914 may be a 0.15 mm Copper spreader, second heat dissipation plate 914 may be a 0.2 mm Copper spreader, and third heat dissipation plate 912 may be a 0.2 mm Copper connector. Third heat dissipation plate 912 may be in thermal contact with first heat dissipation plate 910 and/or second heat dissipation plate 914. In another implementation connecting wire 908 may include a thermally conductive element to create a thermal connection between first heat dissipation plate 910 and second heat dissipation plate 914.

The angle between first housing 902 and second housing 904 may also be increased to facilitate cooling of the components housed therein. In one implementation the angle between first housing 902 and second housing 904 must be at least 45° to permit operation of foldable wireless communications device 900.

In another implementation, hinge assembly 906 is a heat sink formed of materials with higher thermal conductivities than the first housing 902 and second housing 904. In this configuration, heat can flow to hinge assembly 906 via first housing 902 and second housing 904 or via thermal dissipation plates placed therein.

Figure 10:
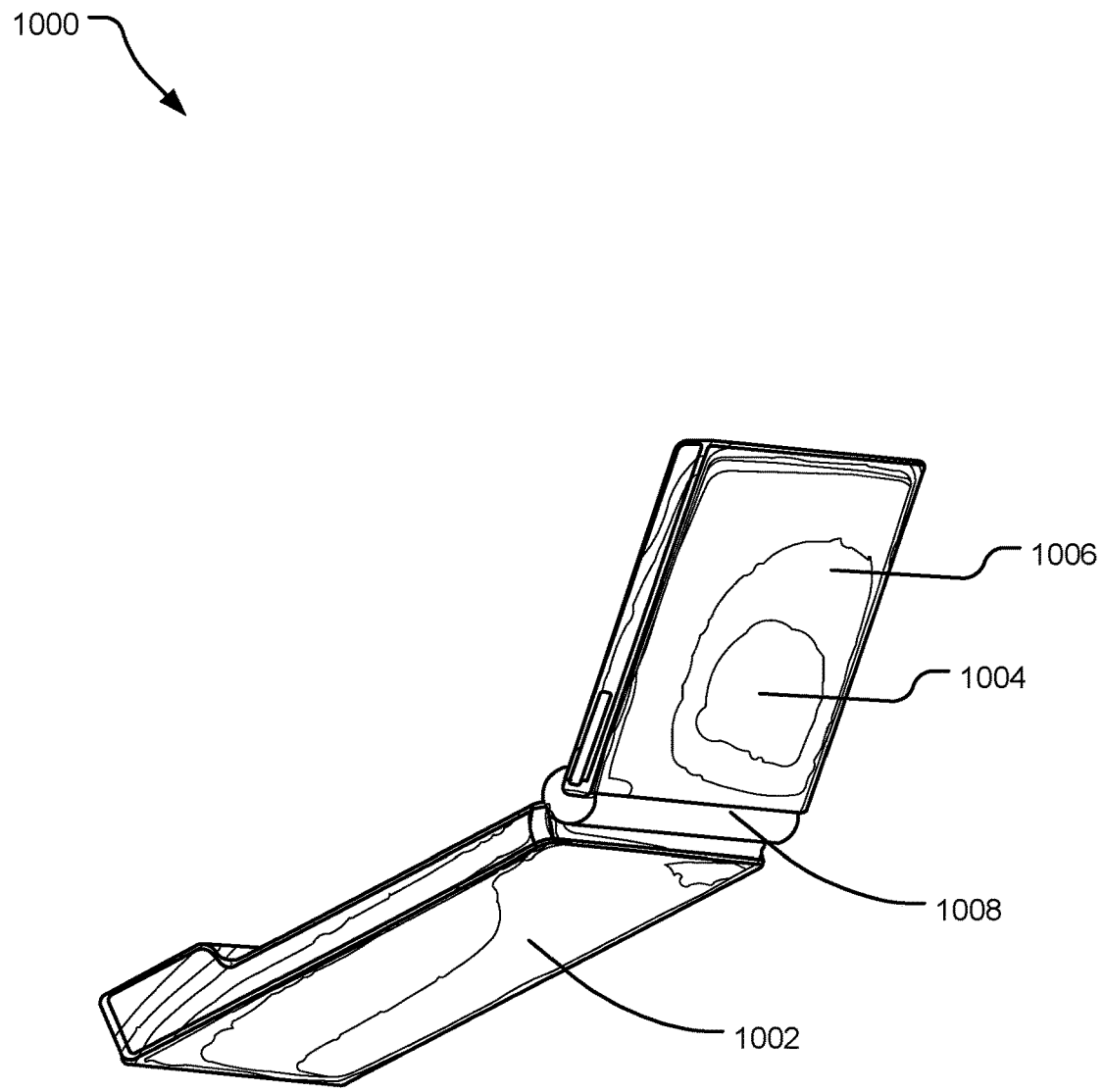
FIG. 10 is a thermal view one side of a folding wireless communications device in operation.

FIG. 10 is a thermal view one side of a wireless communications device 1000 in operation. The thermal view illustrates a sample range of temperatures during operation across the surfaces of wireless communications device 1000. In an implementation, these temperatures were observed to range from 29.2 degrees Celsius to 56.7 degrees Celsius. In the implementation of FIG. 10, a solid temperature of approximately 54.350 degrees Celsius was observed in the region 1004 on the back of wireless communications device 1000. Another solid temperature of approximately 49.807 was observed in region 1006, and a solid temperature of approximately 49.101 degrees Celsius was observed in the region 1002. It should be appreciated from this thermal view that a locus of relatively higher temperature is centered on region 1004 with lower temperatures in the surrounding areas. It should also be appreciated that a separation interface, hinge assembly 1008, is implemented as a heat sink relative to the two adjoining housings, and maintains a solid temperature roughly the same as the adjacent portions of the adjoining housings with which it is in thermal contact.

Figure 11:
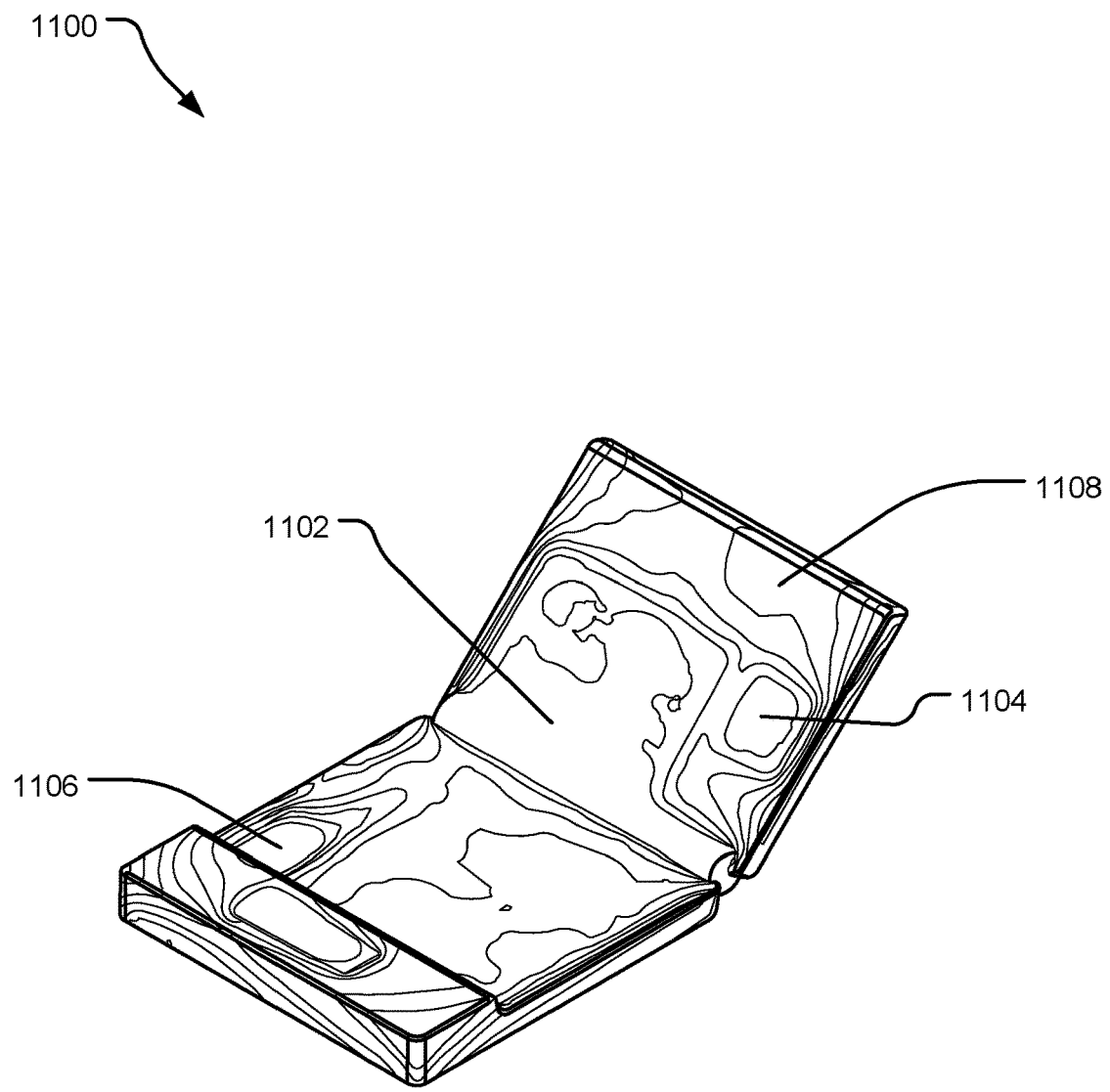
FIG. 11 is a thermal view of another side of a folding wireless communications device in operation.

FIG. 11 is another thermal view of wireless communications device 1100 in operation. In this implementation, solid temperatures were observed in the range of approximately 29.2 to 56.7 degrees Celsius. In this implementation, a local maximum solid temperature of approximately 55.795 degrees Celsius was observed in the region 1106 with lower solid temperatures in the surrounding regions. Solid temperatures of approximately 50.153 degrees Celsius and approximately 48.285 degrees Celsius were observed in the regions 1102 and 1104, respectively. Regions 1102 and 1004 are also roughly local maximums with the surrounding regions measuring lower relative solid temperatures as indicated by the heat map lines of FIG. 11.

Figure 12:
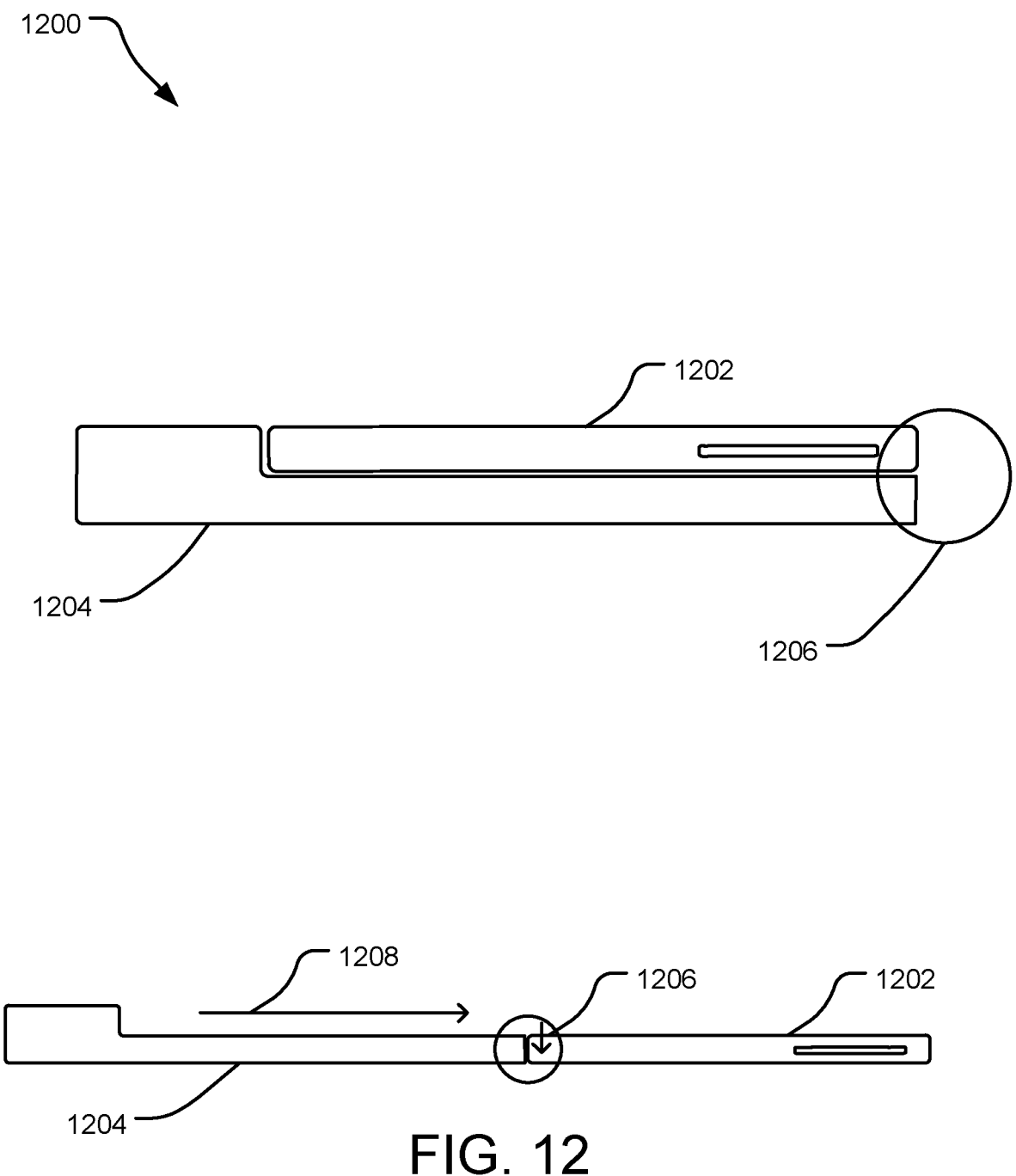
FIG. 12 is a side view of another implementation of a wireless communications device.

FIG. 12 is a side view of another implementation of a wireless communications device 1200. Wireless communications device 1200 includes a first housing 1202 disposed above a second housing 1204. The two housings are moveable with respect to each other around a separation interface 1206 from a closed position into an open position as shown in FIG. 12. Separation interface 1206 permits slidable movement in direction 1208 of first housing 1202 with respect to second housing 1204. In an implementation, separation interface 1206 further permits vertical movement 1206 of first housing 1202 with respect to second housing 1204, such that the two housings sit flush with respect to one another. In an implementation, separation interface 1206 may be a cantilever interface to facilitate movement of wireless communications device 1200 between the open and closed positions.

Figure 13:
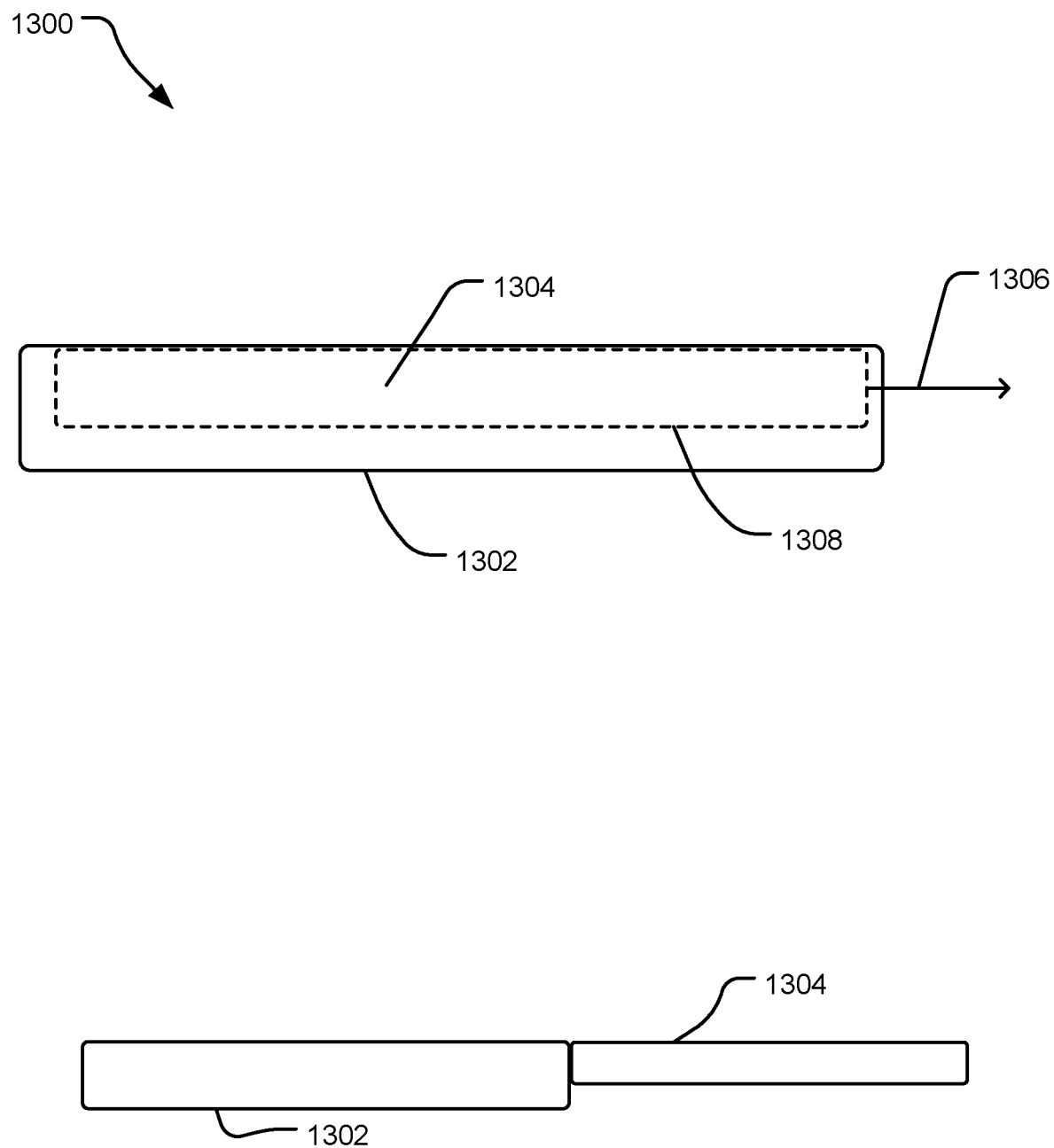
FIG. 13 is a side view of another implementation of a wireless communications device.

FIG. 13 is a side view of another implementation of a wireless communications device 1300. Wireless communications device 1300 includes a second housing 1304 dispose inside of a first housing 1302. In an implementation, wireless communications device 1300 includes a separation interface 1308 to facilitate movement of second housing 1304 in direction 1306 with respect to first housing 1302. Separation interface 1308 may slidably couple the two housings using a friction fit and track interface between the two housings. In the open position, second housing 1304 may extend partially or completely beyond the end of first housing 1302 in direction 1306 as shown in FIG. 13.

Figure 14:
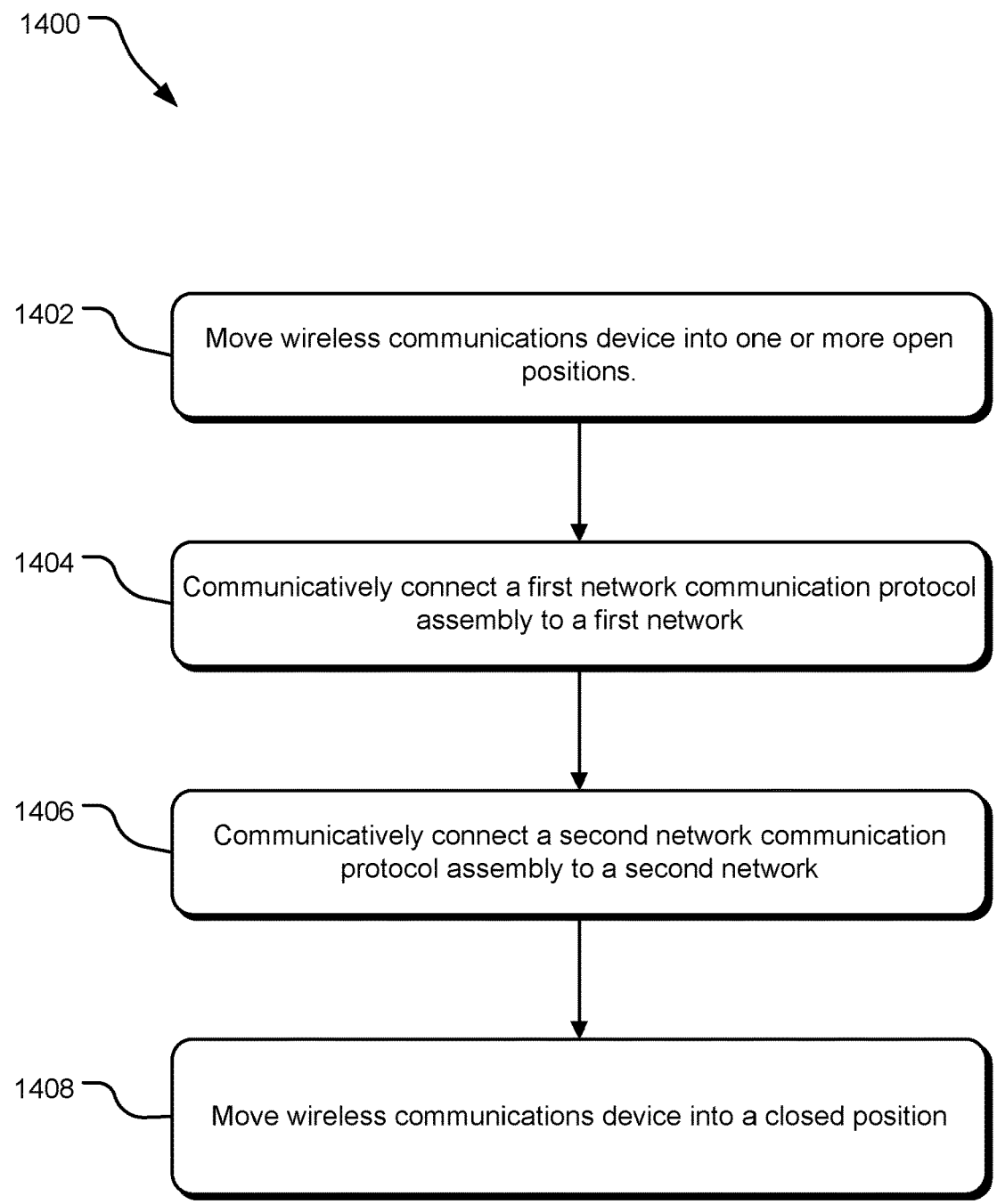
FIG. 14 illustrates example operations for providing network data communications to a personal computing device via a wireless communications device.

FIG. 14 illustrates example operations 1400 for providing network data communications to a personal computing device via a wireless communications device. In implementations, one or more antennas, an LTE modem, and/or Wi-Fi antennas may provide network data communications to the personal computing device. A moving operation 1402 moves a wireless communications device into one or more open positions. A user of the wireless communications device may manually move the device into one or more open positions. In implementations, a hinge assembly may move a first housing including at least a first network communication protocol assembly with respect to a second housing including at least a second network communications protocol assembly. In other implementations, a separation interface may move a first housing including at least a first network communication protocol assembly with respect to a second housing including at least a second network communications protocol assembly. The wireless communications device may be moveable according to a separation interface, including without limitation a hinge assembly, a cantilever assembly, a friction fit interface, and/or a track and roller interface. The wireless communications device includes at least a first network communications protocol assembly with one or more antennas or ports configured to communicatively connect to a first network according to the first network protocol. A connecting operation 1404 communicatively connects the first network communications protocol to the first network. In an implementation, the first network protocol assembly may be an LTE modem and a plurality of LTE antennas. In implementations, the LTE modem may communicatively connect the first network communication protocol assembly to a first network. The first network communications assembly may be connected in a number of ways. The device may execute instructions stored on an onboard memory to connect to available wireless networks automatically upon detection. In an implementation, the wireless communications device may cause a control panel interface to appear on a connected personal computing device to display a user interface suitable for controlling the wireless communications device and receiving user input to cause the LTE modem to connect to an available wireless data network.

In one implementation, the wireless communications device includes at least a second network communications protocol assembly with one or more antennas or ports configured to communicatively connect to a second network according to the second network protocol, which is a network protocol different from the first network protocol. Another connecting operation 1406 communicatively connect the second network communication protocol assembly to the second network. In one implementation, the second network communications assembly connects to a personal computing device according to a Wi-Fi protocol. In another implementation, the second network communications assembly may be connected by a user selecting a Wi-Fi SSID broadcast by the wireless communications device on a personal computing device desired to be connected. A user may select the Wi-Fi network manually according to the interface of the personal computing device. The user may perform this connecting operation 1406 according other wireless communications protocols in the same way, such as Bluetooth or NFC. In an implementation, the user may connect the second network communications assembly to a personal computing device by configuring the personal computing device to automatically connect to Wi-Fi networks that have been previously connected to the device such as a Wi-Fi network broadcast by the wireless communications device. A moving operation 1408 moves the wireless communications device into a closed position.

Figure 15:
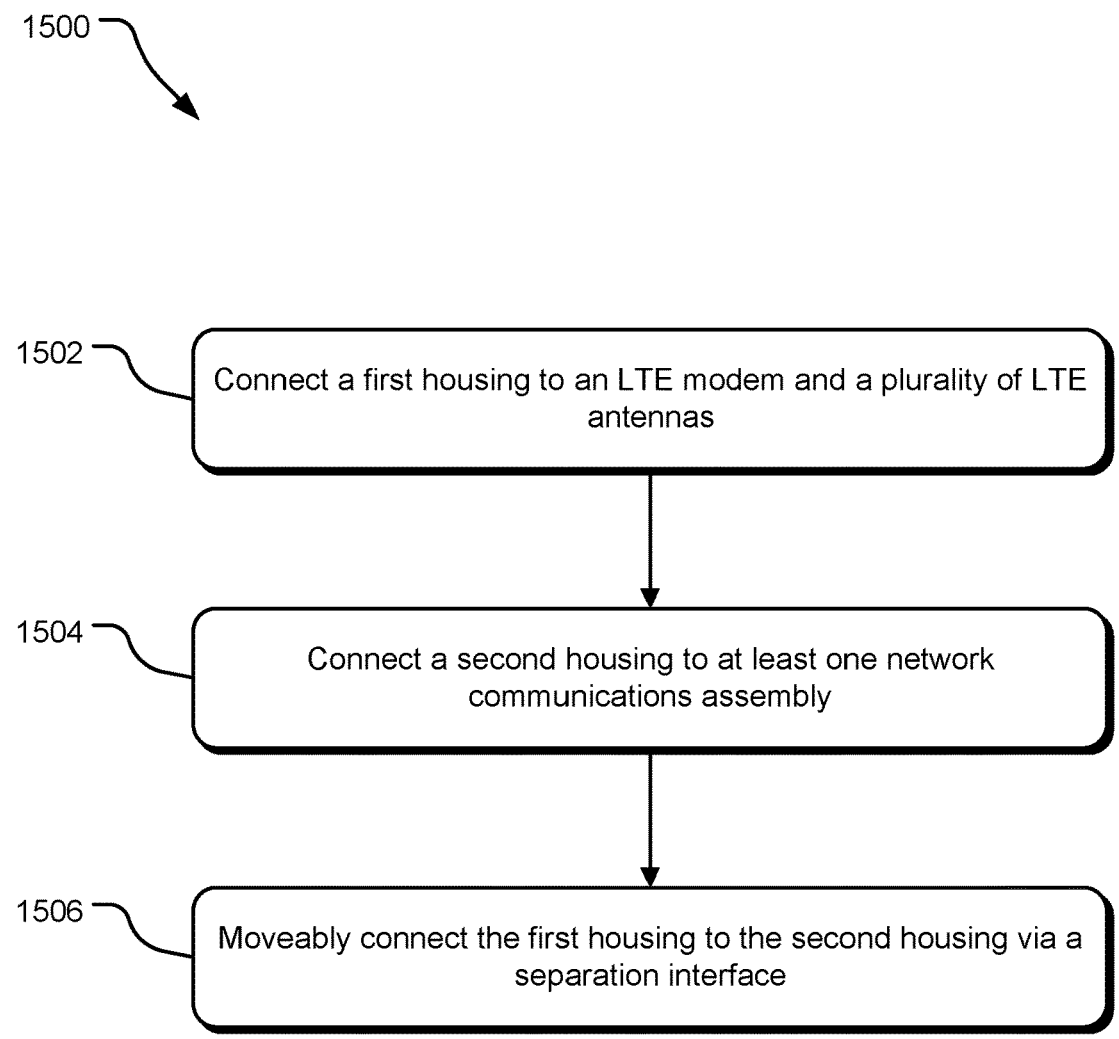
FIG. 15 illustrates example operations for manufacturing a wireless communications device.

FIG. 15 illustrates example operations for 1500 manufacturing a wireless communications device. A connection operation 1502 connects a first housing to an LTE modem and a plurality of LTE antennas. Manufacturing devices including injection molding, extruding, and/or other manufacturing devices may perform connection operation 1502 and/or other connecting operations disclosed herein. The first housing may be formed of materials including black plastic or polycarbonate. In an implementation, the first housing may be formed using equipment including any one or more of a reactor, holding tank, centrifuge, demineralizer, concentrator, extruder, and pelletizer. The polycarbonate material may be extruded into the desired shape of the first. Another connection operation 1504 connects a second housing to at least one network assembly. Manufacturing devices including injection molding, extruding, and/or other manufacturing devices may perform connection operation 1504 and/or other connecting operations disclosed herein Yet another connecting operation 1506 connects the first housing to the second housing movably via a separation interface, such that the first housing and second housing move with respect to each other between a closed position and one or more open positions. The one or more open positions may be characterized by an increased thermal separation between the components disposed within the first and second housings, respectively. In an embodiment, the separation interface is a hinge assembly. The hinge may be constructed according any rotational hinge designs including a free fit or friction fit design. Manufacturing a wireless communications device may further include any combination of attaching a first thermal dissipation plate, a second heat dissipation plate, and/or a third heat dissipation plate to the first housing, second housing, and/or hinge assembly, respectively. Making a wireless communications device may further include forming one or more heat vent openings in the body of the first and/or second housings. Manufacturing a wireless communications device may further include forming a second housing including a display screen and/or a power switch, which may be integrated into, or a part of, the display screen.

An example system includes a wireless communications device comprising a first housing including an LTE modem and a plurality of LTE antennas. The example device also includes a second housing including at least one network communications assembly, wherein the first housing and second housing moveably joined via a separation interface permitting movement of the first housing and second housing with respect to each other between a closed position and one or more open positions.

Another example system of any preceeding system includes a device wherein the plurality of LTE antennas are communicatively coupled via at least two feeds diplexed into a single PCB trace into the LTE modem.

Another example system of any preceeding system includes a plurality of LTE antennas are communicatively coupled via at least three feeds triplexed into a single PCB trace into the LTE modem.

Another example system of any preceeding system includes a separation interface is a hinge assembly.

Another example system of any preceeding system includes a plurality of LTE antennas are spiral feed MIMO monopole antennas, each LTE antenna including a grounded coupling structure.

Another example system of any preceeding system includes a hinge assembly includes a flex circuit electronically coupling the contents of the first housing to the contents of the second housing.

Another example system of any preceeding system includes a separation interface is a heat sink between the first housing and second housing.

Another example system of any preceeding system includes a first housing and second housing each measure substantially 90 mm in width by 57 mm in length.

Another example system of any preceeding system includes at least two of the plurality of LTE antennas are positioned with respect to one another closer than ¼ of the wavelength of the lowest frequency band supported by the LTE antennas.

An example system includes providing means for providing network data communications to a personal computing device via a wireless communications device. The example system also includes moving means for moving a first housing including at least a first network communication protocol assembly with respect to a second housing including at least a second network communication protocol assembly, the first housing and the second housing moveably joined via a separation interface, from a closed position into one or more open positions. The example system also includes communicative connecting means for communicatively connecting the first network communication protocol assembly to a first network. The example system also includes communicative connecting means for communicatively connecting the second network communication protocol assembly to a second network.

An example system includes connecting means for connecting a first housing to an LTE modem and a plurality of LTE antennas. The example system also includes connecting means for connecting a second housing to at least one network communications assembly. The example system also includes connecting means for connecting the first housing to the second housing via a separation interface such that the first housing and second housing are moveable with respect to each other between a closed position and one or more open positions.

An example method includes providing network data communications to a personal computing device via a wireless communications device. The example method also includes moving a first housing including at least a first network communication protocol assembly with respect to a second housing including at least a second network communication protocol assembly, the first housing and the second housing moveably joined via a separation interface, from a closed position into one or more open positions. The example method also includes communicatively connecting the first network communication protocol assembly to a first network, and communicatively connecting the second network communication protocol assembly to a second network.

Another example method of any preceding method provides the wireless communications device includes a position sensor activated when the device is in the one or more open positions.

Another example method of any preceding method provides the position sensor is a hall effect sensor.

Another example method of any preceding method provides the first housing includes a memory operable to store digital files received from the personal computing device via the network communications assembly.

Another example method of any preceding method provides the second network communications protocol assembly includes one or more Wi-Fi antennas.

An example method includes manufacturing a wireless communications device including connecting a first housing to an LTE modem and a plurality of LTE antennas. The example method also includes connecting a second housing to at least one network communications assembly, and connecting the first housing to the second housing via a separation interface such that the first housing and second housing are moveable with respect to each other between a closed position and one or more open positions.

Another example method of any preceding method provides affixing a first thermal distribution plate to the first housing and affixing a second thermal distribution plate to the second housing.

Another example method of any preceding method provides affixing a third thermal distribution plate to the separation interface wherein the third thermal distribution plate is thermally coupled to the second thermal distribution plate in at least one of the one or more open positions.

Another example method of any preceding method provides forming a heat vent opening in the first housing.

Another example method of any preceding method provides a display screen disposed in the second housing includes at least one of: a mobile signal strength indicator, a battery level indicator, the name of a wireless carrier, and a network throughput indicator.

Another example method of any preceding method provides the first housing includes at least one processing device operable to cause the display of at least one of the following on the screen of the personal computing device: a mobile signal strength indicator, a battery level indicator, the name of a wireless carrier, and a network throughput indicator.

The above specification, examples, and data provide a complete description of the structure and use of exemplary embodiments of the invention. Since many embodiments of the invention can be made without departing from the spirit and scope of the invention, the invention resides in the claims hereinafter appended. Furthermore, structural features of the different embodiments may be combined in yet another embodiment without departing from the invention.

What is claimed is:

1. A wireless communications device comprising:
   a first housing to a first network communications assembly, the first network communications assembly configured to communicatively connect to a wireless network external to the wireless communications device according to a first network protocol and including a first modem and at least one antenna, the first housing including a first thermal distribution plate for dissipating heat produced by at least the first modem of the first housing; and
   a second housing to a second network communications assembly, the second network communications assembly configured to communicatively connect to another network external to the wireless communications device according to a second network protocol, the second network protocol being different from the first network protocol, the second network communications assembly including a second modem and at least one other antenna, the second housing including a second thermal distribution plate for dissipating heat produced by at least the second modem of the second housing, wherein the first housing is connected to the second housing via a separation interface the first housing and second housing being moveable with respect to each other between a closed position and one or more open positions, the separation interface is implemented as a heat sink configured to dissipate heat produced by at least the first modem of the first housing and the second modem of the second housing.

2. The wireless communications device of claim 1, wherein the first housing further includes a heat vent opening formed in the first housing.

3. The wireless communications device of claim 1, wherein the first network communications assembly includes an LTE modem and a plurality of LTE antennas for communicatively connecting to an LTE network.

4. The wireless communications device of claim 1, wherein the heat sink is formed of materials with higher thermal conductivities than the first housing and the second housing.

5. The wireless communications device of claim 1, wherein the heat sink is further thermally coupled to the first thermal distribution plate in at least one of the one or more open positions.

6. The wireless communications device of claim 1, wherein the first housing at least partially encloses the first network communication assembly including the first modem and the at least one antenna and the second housing at least partially encloses the second network communication assembly including the second modem and the at least one other antenna.

7. The wireless communications device of claim 1, wherein the separation interface is a hinge assembly.

8. The wireless communications device of claim 1, wherein the separation interface is a slidable coupling.

9. A wireless communications device comprising:
   a first housing including a first modem; and
   a second housing including a second modem, wherein the first housing and second housing moveably joined via a separation interface permitting movement of the first housing and second housing with respect to each other between a closed position and one or more open positions, the separation interface being implemented as a heat sink configured to dissipate heat produced by at least the first modem of the first housing and the second modem of the second housing.

10. The wireless communications device of claim 9, wherein the first modem is an LTE modem and the first housing further includes a plurality of LTE antennas that are communicatively coupled via at least two feeds multiplexed into a single PCB trace into the LTE modem.

11. The wireless communications device of claim 9, wherein the separation interface is a hinge assembly.

12. The wireless communications device of claim 9, wherein the separation interface is a hinge assembly and the hinge assembly includes a flex circuit electronically coupling electronic contents of the first housing to electronic contents of the second housing.

13. The wireless communications device of claim 9, wherein the separation interface is a slidable coupling.

14. A method of providing network data communications to a personal computing device via a wireless communications device, the method comprising:
   connecting a first housing to a first modem;
   connecting a second housing to a second modem; and
   connecting the first housing to the second housing via a separation interface such that the first housing and second housing are moveable with respect to each other between a closed position and one or more open positions, the separation interface being implemented as a heat sink configured to dissipate heat produced by at least the first modem of the first housing and the second modem of the second housing.

15. The method of claim 14, wherein the first modem is an LTE modem and the first housing further includes a plurality of LTE antennas that are communicatively coupled via at least two feeds multiplexed into a single PCB trace into the LTE modem.

16. The method of claim 14, wherein the wireless communications device includes a position sensor activated when the device is in the one or more open positions.

17. The method of claim 16, wherein the position sensor is a hall effect sensor.

18. The method of claim 14, wherein the separation interface is a hinge assembly.

19. The method of claim 14, wherein the separation interface is a hinge assembly and the hinge assembly includes a flex circuit electronically coupling electronic contents of the first housing to electronic contents of the second housing.

20. The method of claim 14, wherein the separation interface is a slidable coupling.

* * * * *